US007900344B2

(12) United States Patent
Ng et al.

(10) Patent No.: US 7,900,344 B2
(45) Date of Patent: Mar. 8, 2011

(54) CABLE AND CONNECTOR ASSEMBLY APPARATUS

(75) Inventors: Raymond H. Ng, Burr Ridge, IL (US); James B. Davis, Orland Park, IL (US); Jim Carlock, Homer Glen, IL (US); Mike Quinlan, Tinley Park, IL (US); Rich Gudgel, Romeoville, IL (US)

(73) Assignee: CommScope, Inc. of North Carolina, Hickory, NC (US)

( * ) Notice: Subject to any disclaimer, the term of this patent is extended or adjusted under 35 U.S.C. 154(b) by 531 days.

(21) Appl. No.: 12/046,814

(22) Filed: Mar. 12, 2008

(65) Prior Publication Data

US 2009/0232594 A1 Sep. 17, 2009

(51) Int. Cl.
*B23P 19/00* (2006.01)
*H05K 13/04* (2006.01)

(52) U.S. Cl. ................. 29/729; 29/709; 29/748; 29/760; 29/787

(58) Field of Classification Search .................... 29/729, 29/709, 748, 760, 787, 828, 854, 857, 860
See application file for complete search history.

(56) References Cited

U.S. PATENT DOCUMENTS

| | | | | |
|---|---|---|---|---|
| 4,685,608 | A | 8/1987 | Kujas | |
| 4,858,310 | A | 8/1989 | Sanders | |
| 4,983,804 | A * | 1/1991 | Chan et al. | 219/616 |
| 4,987,283 | A | 1/1991 | Beinhaur et al. | |
| 5,093,545 | A | 3/1992 | McGaffigan | |
| 5,093,987 | A | 3/1992 | Scholz | |
| 5,290,984 | A | 3/1994 | Gerhard, Jr. | |
| 5,579,575 | A | 12/1996 | Lamome et al. | |
| 5,675,891 | A | 10/1997 | Childs et al. | |
| 5,802,710 | A | 9/1998 | Bufanda et al. | |
| 6,188,052 | B1 | 2/2001 | Trucco | |
| 6,229,124 | B1 | 5/2001 | Trucco | |
| 6,300,783 | B1 | 10/2001 | Okubo et al. | |
| 6,608,291 | B1 | 8/2003 | Collins et al. | |
| 6,667,440 | B2 | 12/2003 | Nelson et al. | |
| 7,122,770 | B2 | 10/2006 | Thomas et al. | |
| 7,127,806 | B2 | 10/2006 | Nelson et al. | |
| 2001/0001464 | A1 | 5/2001 | Godwin | |
| 2004/0003936 | A1 | 1/2004 | Schmitt et al. | |
| 2004/0016741 | A1 | 1/2004 | Evanyk | |
| 2005/0274717 | A1 | 12/2005 | Kataoka et al. | |

FOREIGN PATENT DOCUMENTS

JP 02 066864 3/1990

OTHER PUBLICATIONS

Examiner Durand, EPO Search Report of related patent application No. EP09001432, Munich DE, Jul. 3, 2009.

* cited by examiner

*Primary Examiner* — Thiem Phan
(74) *Attorney, Agent, or Firm* — Babcock IP, PLLC

(57) ABSTRACT

A cable assembly apparatus for coupling a connector to a cable having a base supporting an interface pedestal dimensioned to receive the connector; an inductor coil coupled to an inductor coil actuator operable to move the inductor coil between a load position and an operation position proximate the interface pedestal; a grip clamp operable by a clamp actuator to move between an open position and a closed position above the interface pedestal; and a temperature sensor configured to read a temperature proximate the interface pedestal. A method for using the apparatus retains the pre-assembled connector and cable in an aligned orientation for controlled heating by the induction heater to heat a solder preform to solder the connector to an outer conductor of the cable.

9 Claims, 4 Drawing Sheets

CABLE AND CONNECTOR ASSEMBLY APPARATUS

BACKGROUND OF THE INVENTION

1. Field of the Invention

The invention relates to a cable assembly apparatus. More specifically, the invention relates to a cable assembly apparatus for induction soldered connector and cable assemblies.

2. Description of Related Art

U.S. Pat. No. 5,802,710, titled "Method of Attaching a Connector to a Coaxial Cable and the Resulting Assembly" by Bufanda et al," issued Sep. 8, 1998, owned by CommScope, Inc. as is the present application, discloses an electrical connector for use with coaxial cable and a method for attaching same. As shown in FIG. 1, the connector 1 is configured for attachment via a solder preform 2 that is inserted between the coaxial cable 3 outer conductor 4 and the connector 1 in a pre-assembly step. The solder preform 2 is then heated via external application of an induction heater about the connector 1 to solder the connector 1 and outer conductor 4 together, providing a secure coaxial cable 3 and connector 1 interconnection, as shown in FIG. 2.

The apparatus disclosed for performing the soldering operation is a vise for holding the connector within a circular coil induction heater used to heat the connector to the solder temperature.

Competition within the cable and connector assembly industry has increased the importance of improving the electro-mechanical characteristics of the cable and connector interconnection while minimizing overall assembly time and labor costs.

Therefore, it is an object of the invention to provide a cable assembly apparatus that overcomes deficiencies in the prior art.

BRIEF DESCRIPTION OF THE DRAWINGS

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION

U.S. Pat. No. 5,802,710 is hereby incorporated by reference in the entirety. The inventors have recognized that the prior assembly apparatus, described in U.S. Pat. No. 5,802,710, relied heavily upon individual operator training, skill and motivation, which limited production speed and frustrated quality control. Further, the apparatus and handling of the recently heated assemblies presented a significant burn danger to the operator.

An analysis of connector and cable assemblies with manufacturing defects identified two primary sources of defect: improper temperature and or alignment.

To maximize repeatability and quality control upon the resulting interconnection, the inventor's have determined that element alignment and heat application should be uniform. The heat application should be sufficient to melt the solder preform, but not so excessive that the containment elements are degraded whereby the molten solder can migrate from the desired solder point and or to where the cable becomes overheated and the coaxial cable insulation and or sheathing is damaged. The heating requirement varies, depending upon the size of the cable and type of connector desired. Alignment is a factor in final assembly quality, and also upon the uniformity of heat application.

It has also been recognized that a significant factor of the cost and time delay of distribution for connector terminated cable assemblies is the proximity of the assembly operation to the end user.

Figure 3:
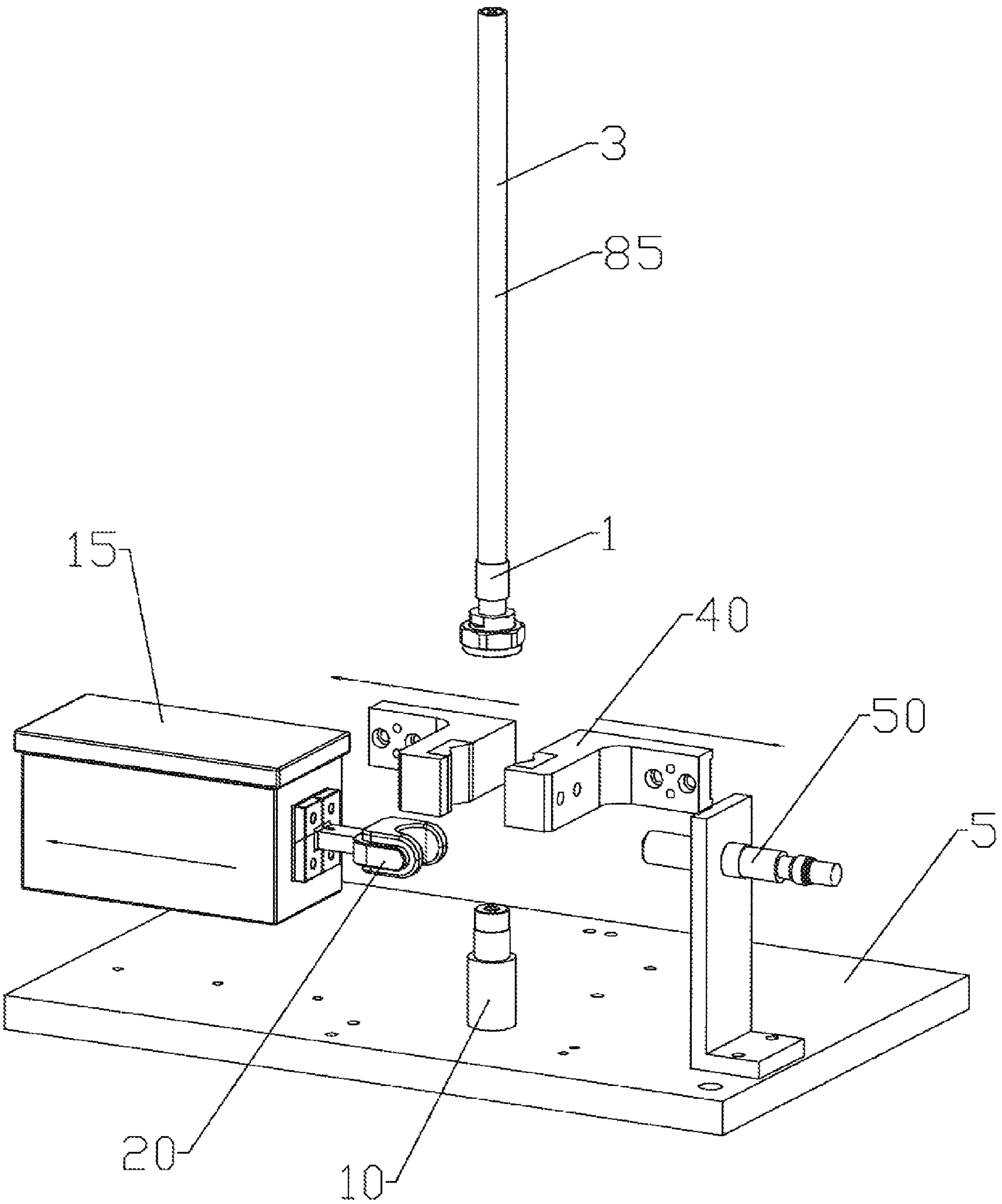
FIG. 3 shows a schematic isometric view of the primary elements of an exemplary embodiment of a cable assembly apparatus in a ready position, electrical interconnections, supporting and enclosure structures removed for clarity.
Figure 4:
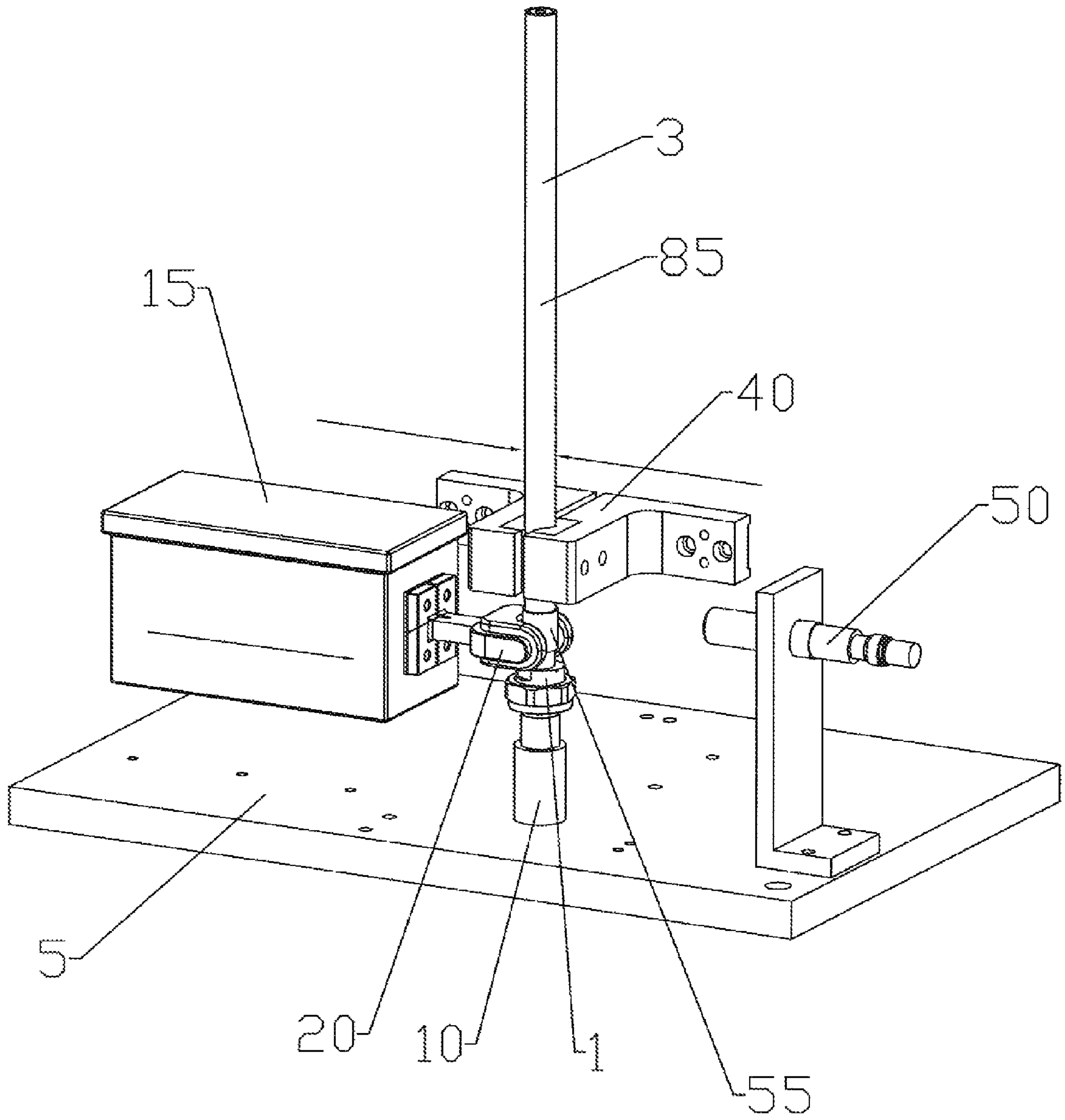
FIG. 4 shows a schematic isometric view of the primary elements of an exemplary embodiment of a cable assembly apparatus in an operation position, electrical interconnections, supporting and enclosure structures removed for clarity.
Figure 5:
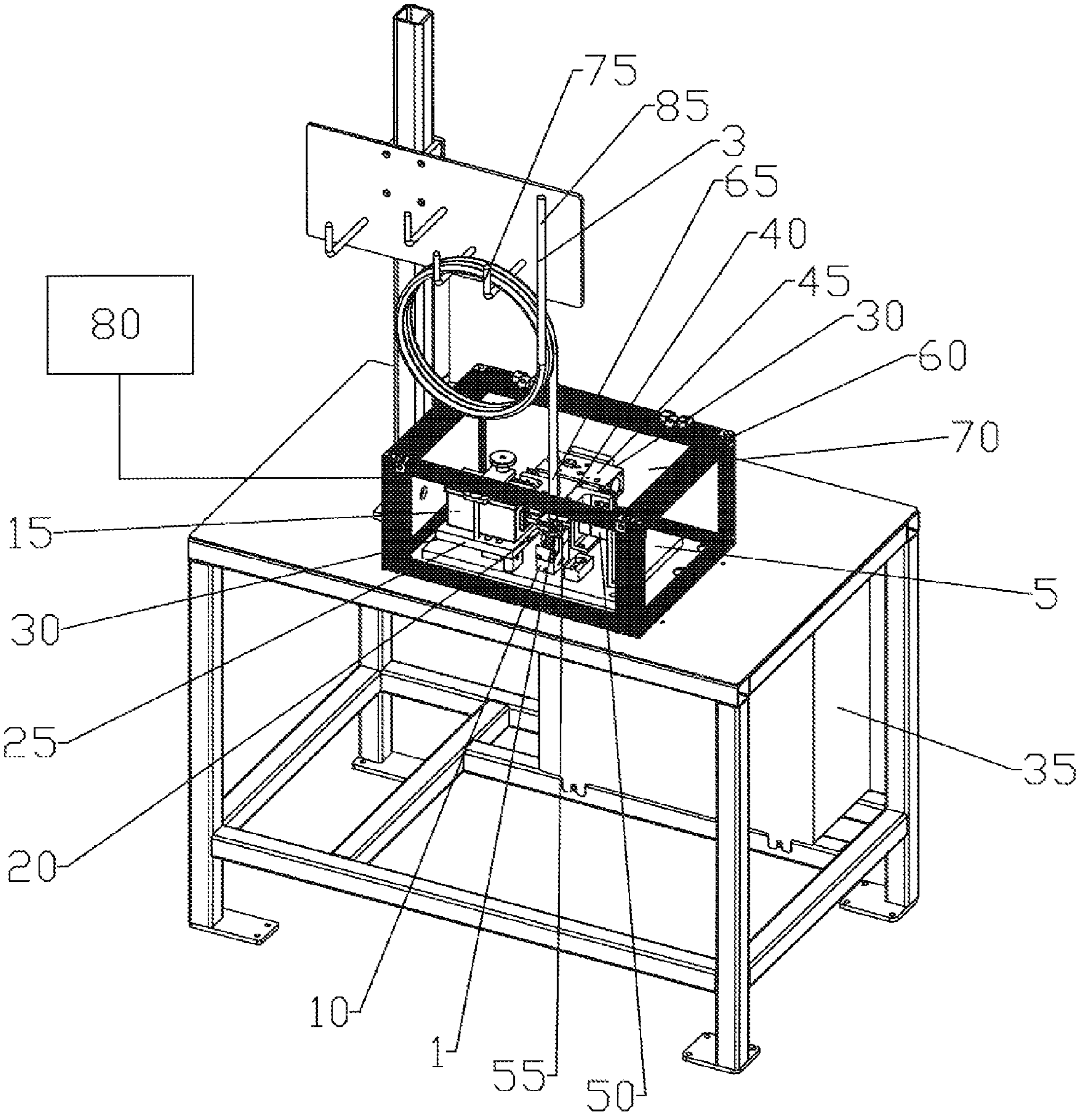
FIG. 5 shows a schematic isometric view of a cable assembly apparatus station including a protective enclosure and cable coil support structure, in an operation position, with an interface pedestal for a right angle connector.

A semi-automated cable assembly apparatus safely usable by an operator with minimal training to repeatedly prepare a high quality cable to connector interconnection is shown in FIGS. 3-5.

Best shown in FIGS. 3 and 4, a base 5 supports a range of exchangeable interface pedestal(s) 10 each configured for example for a specific connector interface and or connector configuration such as a coaxial with the cable longitudinal axis connector 1 (FIGS. 3 and 4) or a right angle connector 1 (FIG. 5). The selected interface pedestal 10 keys the corresponding connector 1 into a repeatable, predefined position and orientation.

Arranged around the interface pedestal 10 is an induction heating module 15 with a preferably u-shaped inductor coil 20. The induction heating module 15 is coupled to an inductor coil actuator 25 operable, for example via an electric motor, air or hydraulic cylinder, to move the induction heating module 15 towards and away from the interface pedestal 10 proximate a preset height selected to position the inductor coil 20 around the area of the connector 1 where, within the connector 1, the solder preform will be positioned. Feedback position sensor(s) 30, may be located, for example in the induction heating module, to provide position feedback and or interlock signals to a control unit 35, such as an industrial programmable logic controller or a manual control and status switch panel.

A cable grip clamp 40 with an clamp actuator 45 such as an electric motor, air or hydraulic cylinder operable via the control unit 35 to move the grip clamp 40 between an open (FIG. 3) and a closed position (FIG. 4) is positioned to securely grip the coaxial cable 3, aligned with the interface pedestal 10, when in the closed position.

A temperature sensor 50, preferably a non-contact temperature sensor such as an infra-red optical temperature sensor, is preferably positioned to read the temperature of the outer surface of a connector 1 seated upon the interface pedestal 10, at the location corresponding to the solder preform 2, at the open side 55 of the inductor coil 20. An output of the temperature sensor 50 may be coupled to a temperature display and or to the control unit 35 as a feedback signal.

As shown in FIG. 5, the apparatus may be enclosed within a protective enclosure 60, for example formed from acrylic panels with a metal frame, with a top opening 65 for passage of the cable and or cable with pre-attached connector 1. One or more access door(s) 70 to the enclosure 60 may include sensors (not shown) coupled to the control unit 35 to provide safety interlocks and or door closure feedback.

A plurality of hook(s) 75 may be positioned above the apparatus to support coils of the desired coaxial cable(s) at a proper location with respect to the top opening 65 such that a cable end extends from the coil straight through the top opening 65 normal to the base 5 and interface pedestal.

The induction heating module 15, various actuators and sensors may each be coupled to the control unit 35 as inputs and or outputs, and the control unit 35 provided with a matrix of process times and temperatures to provide repeatable semi-automatic operation of the apparatus. An operator interface 80, such as a touch screen and or thumbwheel switche(s) or the like may be coupled to the control unit 35 such that the operator need only enter the coaxial cable 3 and connector 1 type(s) to be interconnected, mount the preassembly in the apparatus and then press start. Alternatively, the control unit 35 may be provided with switchgear, temperature, time displays and or batch counters for manual operation with hard wired safety/temperature setpoint and or time interlocks.

A detailed exemplary sequence of operation, either semi-automatic or alternatively with each step manually initiated may be performed according to the following steps, herein described with reference to a semi-automatic control unit embodiment of the apparatus.

The cable assembly apparatus is prepared by identifying the cable 3 and connector 1 to be connected to the control unit 35 via selection and or data entry upon the operator interface 80 and if not already present, the corresponding interface pedestal 10 is mounted upon the base 5, for example by a key such as a pin into an aperture such as a hole or slot mounting.

Figure 1:
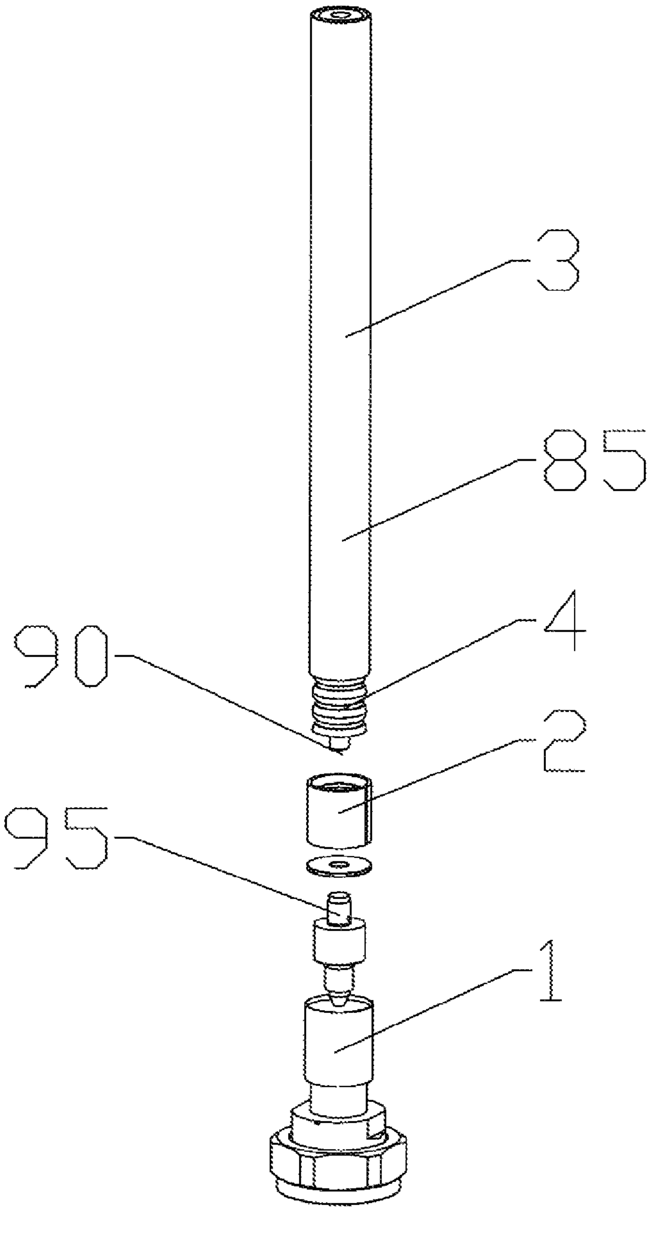
FIG. 1 shows an exploded isometric view of a connector and cable end according to U.S. Pat. No. 5,802,710.
Figure 2:
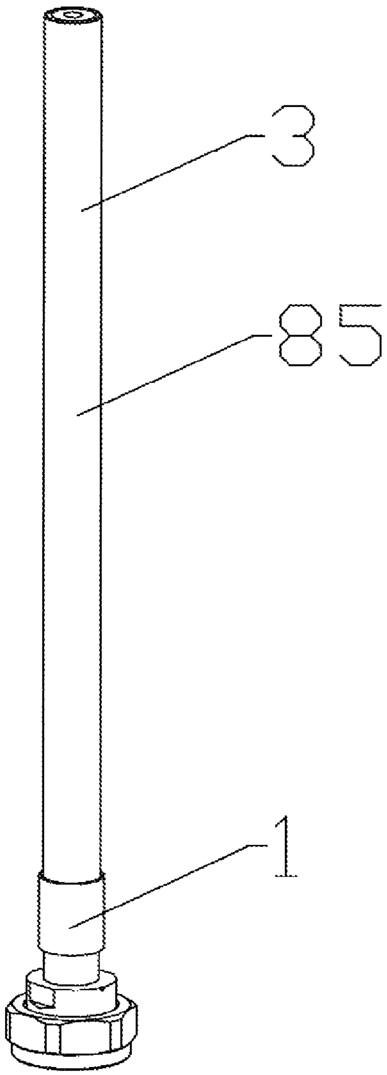
FIG. 2 shows a schematic external isometric view of a connector attached to a cable end according to U.S. Pat. No. 5,802,710.

The operator selects the cable 3 and connector 1 to be assembled, prepares the cable end for connector 1 mounting by striping back the cable sheath 85, outer conductor 4 and insulator (not shown) to expose the inner and outer conductors 90, 4 according to the requirements of the selected connector 1, as best shown for example in FIG. 1. Depending upon the connector 1 type, the inner conductor 90 may be manually soldered or conductive adhesive glued to the inner contact 95, or the inner conductor prepped for an insertion connection with spring fingers or the like of the inner contact 95. A solder preform 2 is placed around the outer conductor 4 and the cable end is inserted, with any additional desired internal elements of the connector 1, into the connectors until seated therein. Proper seating of the cable 3 within the connector 1 may be verified by the position of the inner contact 95 and or bottoming of the outer conductor 4 end into the connector 1.

As shown in FIG. 3, the assembly apparatus is in a ready state with the grip clamp 40 open and the inductor coil 20 retracted to a load position (FIG. 3). The operator then inserts the cable 3 and connector 1 preassembly vertically downward through the opening 65, past the grip clamp 40 and onto the interface pedestal 10.

If any access safety interlocks that may be present, such as enclosure access door(s) 70 closed, are satisfied, a start command entered at the operator interface 80 enables the grip actuator to close the grip clamp 40 around the cable 3 securing it aligned with the interface pedestal 10 and thereby with the connector 1 thereon. When position feedback of the grip clamp 40 is satisfied, if present, the inductor coil actuator 25 is enabled to move the inductor coil 20 to an operation position (FIG. 4) towards and around the connector 1. When position feedback on the inductor coil actuator 25, if present, is satisfied, the inductor coil 20 is activated, for a time specified by the data matrix in the control unit 35 corresponding to the cable 3 and connector 1 combination specified by the operator and or until the temperature sensor 50 reads a connector 1 open side 55 first preset temperature that indicates a desired solder temperature setpoint has been reached.

The induction heating of the connector 1, outer conductor 4 and solder preform 2 securely and uniformly solders the connector 1 to the outer conductor 4. When heating is complete, the inductor coil 20 is deactivated and retracted again to the load position.

A cooling step may be performed, for example by activating a cooling jet of air upon the connector 1 and or the connector temperature may be monitored via the temperature sensor 50 until a second preset temperature setpoint is reached. When the cooling step is complete, the grip clamp 40 is released and the operator signaled to remove the finished cable end from the cable assembly apparatus.

One skilled in the art will recognize that because the cable assembly apparatus generally removes the prior cable and connector alignment and also the correct heat application duties from the operator, the quality of the resulting interconnections are greatly improved. Further, because safety interlocks integral to the cable assembly apparatus isolates the operator from the actuator motion and hot elements, operator safety is greatly increased.

Because the control unit 35 handles the temperature setpoints and pre-soldering alignment, productivity is increased and rework/scrap is decreased without requiring a highly trained and or motivated operator, lowering labor costs significantly. Also, because the cable assembly apparatus increases safety and lowers the training requirements for the operator, the apparatus may be located at small/remote distribution facilities where they can be safely operated by relatively untrained personnel, to provide local end users with high quality finished cable assemblies of custom length(s), on demand.

Table of Parts

| | |
|---|---|
| 1 | connector |
| 2 | solder preform |
| 3 | cable |
| 4 | outer conductor |
| 5 | base |
| 10 | interface pedestal |
| 15 | induction heating module |
| 20 | inductor coil |
| 25 | inductor coil actuator |
| 30 | position sensor |
| 35 | control unit |
| 40 | grip clamp |
| 45 | clamp actuator |
| 50 | temperature sensor |
| 55 | open side |
| 60 | enclosure |
| 65 | opening |
| 70 | access door |
| 75 | hook |
| 80 | operator interface |
| 85 | sheath |
| 90 | inner conductor |
| 95 | inner contact |

Where in the foregoing description reference has been made to ratios, integers or components having known equivalents then such equivalents are herein incorporated as if individually set forth.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details, representative apparatus, methods, and illustrative examples shown and described. Accordingly, departures may be made from such details without departure from the spirit or scope of applicant's general inventive concept. Further, it is to be appreciated that improvements and/or modifications may be made thereto without departing from the scope or spirit of the present invention as defined by the following claims.

We claim:

1. A cable assembly apparatus for coupling a connector to a cable, comprising:

a base supporting an interface pedestal dimensioned to receive the connector;

an inductor coil coupled to an inductor coil actuator operable to move the inductor coil between a load position and an operation position proximate the interface pedestal;

a grip clamp operable by a clamp actuator to move between an open position and a closed position above the interface pedestal; and a temperature sensor configured to read a temperature proximate the interface pedestal.

2. The apparatus of claim 1, wherein the inductor coil is U-shaped.

3. The apparatus of claim 1, further including a control unit receiving a temperature signal from the temperature sensor and controlling the activation of the inductor coil, the inductor coil actuator and the grip clamp.

4. The apparatus of claim 3, further including an operator interface coupled to the control unit.

5. The apparatus of claim 1, further including at least one position sensor sensing a position of the inductor coil actuator.

6. The apparatus of claim 1, further including at least one position sensor sensing a position of the grip clamp.

7. The apparatus of claim 1, further including an enclosure around the apparatus, having an opening above the interface pedestal dimensioned for passage of the connector.

8. The apparatus of claim 1, wherein the interface pedestal is coupled to the base via a key inserted into an aperture.

9. The connector of claim 1, wherein the temperature proximate the interface pedestal is at an open side of the connector, when the connector is seated upon the interface pedestal opposite the inductor coil.

* * * * *